United States Patent

Ball

[15] 3,659,224

[45] Apr. 25, 1972

[54] TEMPERATURE STABLE INTEGRATED OSCILLATOR

[72] Inventor: James V. Ball, Sunnyvale, Calif.

[73] Assignee: Signetics Corporation, Sunnyvale, Calif.

[22] Filed: Dec. 7, 1970

[21] Appl. No.: 95,580

[52] U.S. Cl. ....................... 331/111, 331/8, 331/108 C
[51] Int. Cl. ....................... H03k 3/26
[58] Field of Search ....................... 331/111, 108 C, 8

[56] References Cited

UNITED STATES PATENTS 3,444,477 5/1969 Avins ....................... 331/8

*Primary Examiner*—John Kominski
*Attorney*—Flehr, Hohbach, Test, Albritton & Herbert

[57] ABSTRACT

A temperature stable integrated oscillator has a control loop including a flip-flop, a series resistor-capacitor timing circuit, reference voltage means and a comparator. The comparator compares the reference voltages to the voltage swing across the capacitor to actuate the flip-flop and thereby provide the oscillator output frequency. Temperature stability is provided by making both the voltage swing across the flip-flop and the reference voltage proportional to the difference between the power supply voltage and the base emitter drop of associated integrated transistors.

8 Claims, 5 Drawing Figures

INVENTOR.
JAMES V. BALL
BY
Flehr, Hohbach, Test, Albritton & Herbert
ATTORNEYS

INVENTOR.
JAMES V. BALL
BY
Flehr, Hohbach, Test, Albritton & Herbert
ATTORNEYS

INVENTOR.
JAMES V. BALL
BY
Flehr, Hohbach, Test,
Albritton & Herbert
ATTORNEYS

INVENTOR
JAMES V. BALL

BY

Flehr, Hohbach, Test, Albritton & Herbert
ATTORNEYS

TEMPERATURE STABLE INTEGRATED OSCILLATOR

BACKGROUND OF THE INVENTION

The present invention is directed to a temperature stable integrated oscillator and more particularly to an oscillator suitable for use in a phase locked loop.

Where it is desired to use a phase locked loop as a tone decoder, for example, in a telephone dialing system, the stability of the oscillator of the loop is important. This is because the capture range of the loop must be limited (e.g., less than 14 percent) so that an adjacent tone will not be captured and locked onto erroneously.

Integrated oscillator circuits have not heretofore had the above needed temperature stability.

OBJECTS AND SUMMARY OF THE INVENTION

It is, therefore, a general object of the invention to provide a temperature stable integrated oscillator.

It is another object of the invention to provide an oscillator as above which is especially suitable for use in a phase locked loop.

In accordance with the forgoing objects the oscillator comprises a semiconductive substrate and means for supplying a d.c. voltage, V. A flip-flop circuit integrated into the substrate has an output terminal and set and reset terminals. An output signal on the output terminal is provided with a voltage swing proportional to $V - 2V_{be}$ where $V_{be}$ is the base to emitter voltage drop of each of two integrated transistors included in the circuit. A series resistor-capacitor timing circuit is coupled to the output terminal of the flip-flop circuit. Reference voltage means integrated into the substrate provide first and second reference voltages having a difference which is a function of $V - 2V_{be}$ where $V_{be}$ is the base to emitter voltage drop of each of two integrated transistors included in the reference voltage means. Comparator means are coupled to the flip-flop circuit and the resistor-capacitor circuit for respectively actuating the set and reset terminals in response to the voltage swing across the capacitor equalling the first and second reference voltages respectively.

DETAILED DESCRIPTION OF THE PREFERRED EMBODIMENT

Figure 1:
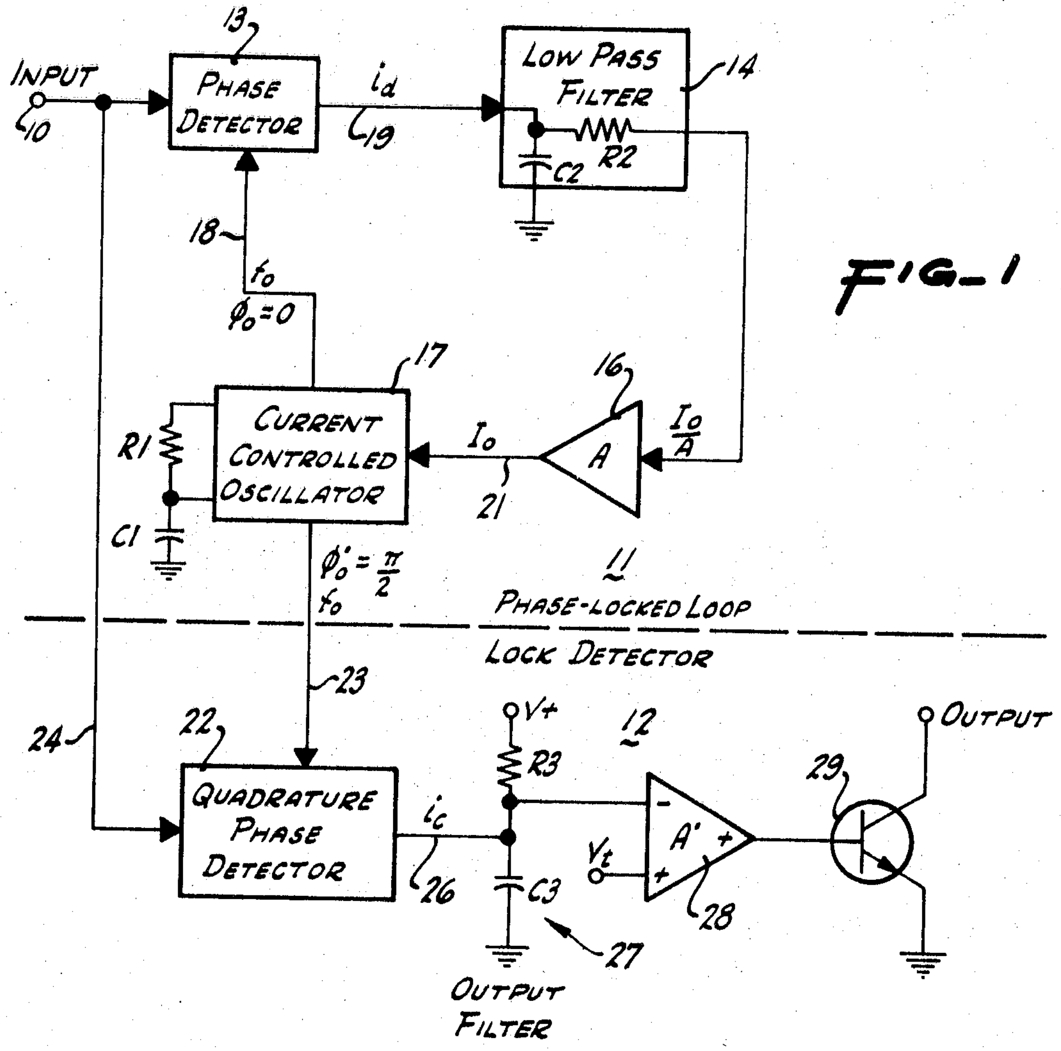
FIG. 1 is a block diagram of a phase locked loop embodying the present invention.

Referring now to FIG. 1, an input signal is applied to terminal 10. Such a signal in the preferred embodiment would be tone signals to or from a telephone line carrying dialing information. Such data information, for example, is separated into two bands, one of which is from 697 to 941 hertz and the second band from 1,209 to 1,633 hertz. Each band includes four tones whose frequencies are normally separated by a margin of at least 10 percent.

The circuit illustrated in FIG. 1 includes a phase locked loop portion 11 and a lock detector portion 12. One of the circuits would be utilized for each tone to be detected. Because the detection band center of the tone decoder is determined by the free running frequency of the oscillator of the phase locked loop, great temperature stability is required. A quadrature type output provides the threshold detection of an in-phase or locked condition of the phase locked loop.

Input terminal 10 is coupled to a phase detector 13 which is a portion of the phase locked loop. The loop also includes a low pass filter 14, a d.c. amplifier 16 and a current controlled oscillator 17. In general, phase detector 13 compares the phase of the frequency of the input signal against the phase of the output signal $f_0$ on line 18 of oscillator 17.

The output current designated $i_d$ on line 19 of phase detector 13 is a measure of the phase difference between these two signals. The error current $i_d$ is coupled to the low pass filter 14 (which includes series resistor R2 and parallel capacitor C2) which eliminates any high frequency components. The output, $I_0/A$ is amplified by d.c. amplifier 16 to produce on line 21 the current $I_0$ which is coupled to oscillator 17 to modify its output frequency $f_0$. The free running frequency of oscillator 17 is primarily determined by the series RC timing networks R1, C1.

In operation when the input signal on line 10 has the same frequency as the oscillator input signal $f_0$ on line 18, the error current $i_d$ is proportional to the phase difference between the input signals. In this mode, the system is referred to as being "locked." Frequency selection by the phase locked loop is obtained due to the presence of low pass filter 14 within the loop. Any input frequency that significantly differs from the free running frequency of oscillator 17 produces a high frequency error signal. This error signal is filtered out or rejected by low pass filter 11. Thus, the system responds only to those frequencies which are very near to the free running frequency of the voltage controlled oscillator. Thus, filter 14 is a basic factor in determining the capture range of the phase locked loop. For example, if the low pass filter cut off frequency is reduced by a factor of 2, the capture range is reduced by the square root of 2. The capture range determines the detection bandwidth of the phase locked loop. In the present circuit this is limited by the maximum controlled oscillator swing to approximately 14 percent. Thus, because the control current $I_0$ can change the oscillator frequency $f_0$ by only ±7 percent, the loop can never lock to a pure frequency farther away than that. This removes the possibility of the loop locking onto the wrong signal since few tone encoding systems require tones closer than 10 percent.

In order to provide a lock detection or indication a quadrature phase detector 22 is coupled to a quadrature output line 23 of oscillator 17 which provides a center frequency $f_0$ at a 90° phase shift as compared to line 18 which is coupled to phase detector 13. Quadrature phase detector 22 also is coupled to input terminal 10 by line 24 to receive the input signal. The output of the quadrature phase detector on line 26 designated $i_c$ is proportional to the sine of the phase difference as compared to the cosine of the phase difference in the case of phase detector 13. As discussed above, when the loop is locked, this cosine function is at a minimum. Thus, the sine function will be at a maximum.

The output of quadrature phase detector 22 is filtered by output filter 27 in order to extract the d.c. component which indicates the locked condition. Filter 27 includes a resistor R3 coupled to positive voltage supply $V^+$ and a capacitor C3 coupled to ground or common. Filter 27 provides an automatic delay which prevents false outputs due to spurious or short lived inputs. The output of capacitor C3 is compared with the reference signal $V_t$ by a differential amplifier 28. The input of amplifier 28 terminates in a power NPN transistor 29 which provides an output indication on its collector terminal indicating that a tone has been received at input terminal 10.

Phase locked loops per se are known in the art as, for example, described in a book entitled *Phase Lock Techniques* by Floyd M. Gardner, published by John Wiley & Sons, 1966. On page 52 of the Gardner book the use of a quadrature phase detector as a locking indication is discussed. The showing of a phase locked loop in integrated form is disclosed and claimed in a copending application entitled "Integrated Frequency Selective Circuit and Demodulator," in the names of Hans R. Camenzind and Alan B. Grebene, Ser. No. 748,349, filed July 28, 1969, assigned to the present assignee and now U.S. Pat. No. 3,564,434. An integrated phase locked loop which includes a phase shift network coupled to the phase locked loop for the purpose of amplitude demodulation is disclosed and claimed in a copending application entitled "Amplitude Demodulator Using a Phase Locked Loop," in the names of Hans R. Camenzind et al, Ser. No. 800,998, filed Feb. 20, 1969 and assigned to the present assignee.

Figure 2:
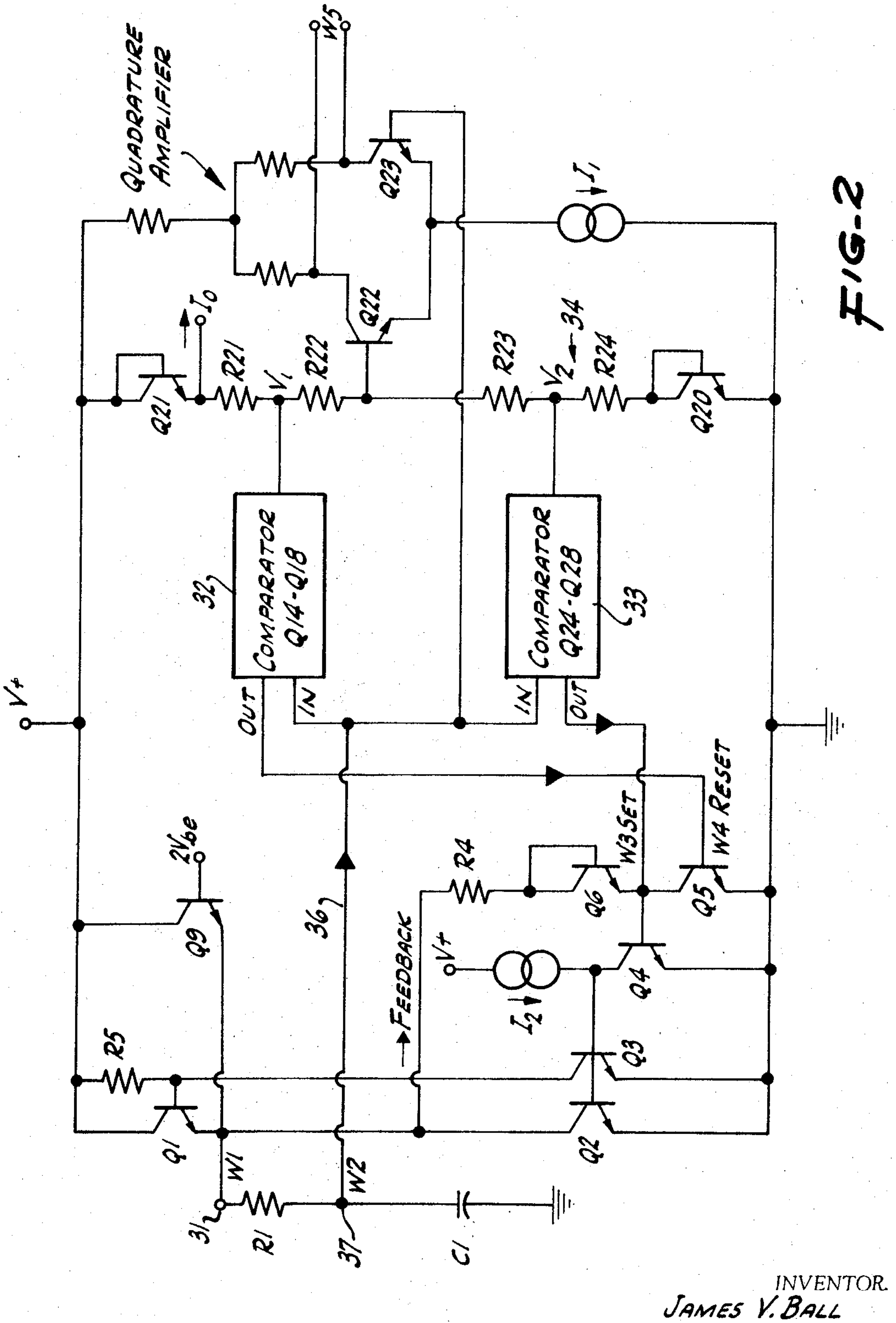
FIG. 2 is a simplified circuit schematic of a portion of FIG. 1.
Figure 3:
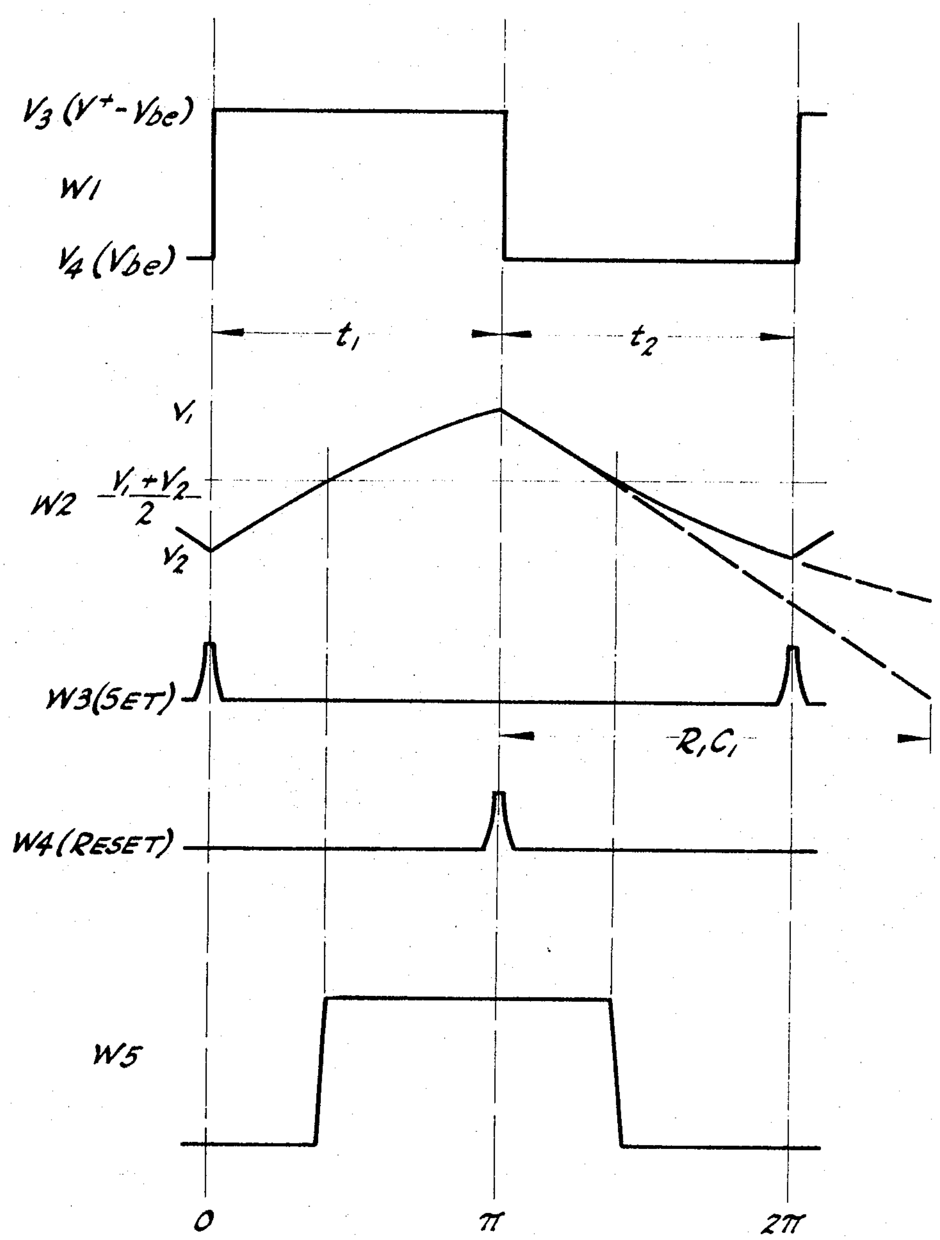
FIG. 3 illustrates waveforms useful in understanding the invention.

Referring now to FIG. 2 and the waveforms W1 through W5 of FIG. 3, transistors Q1 through Q4 form a flip-flop circuit that switches its output as indicated at W1 between the power supply voltage $V^+ - 2V_{be}$ and $V_{be}$ as illustrated by waveform W1 in FIG. 3. This voltage appears on the output terminal 31 coupled to resistor R1. Transistor Q1 has a collector coupled to $V^+$ supply and its emitter is coupled to complementary transistor Q2 whose emitter in turn is coupled to common or ground. Terminal 31 is coupled between the tied emitter and collector of transistors Q1 and Q2 respectively.

A feedback circuit is provided from terminal 31 through series coupled resistor R4 and transistor Q6 connected as a diode. The emitter of Q6 is coupled to the base input of transistor Q4 which is tied between the $V^+$ and ground. A transistor Q5 is coupled between the base input of Q4 and ground also. A transistor Q9 having collector and emitter respectively coupled between $V^+$ and terminal 31 has applied to its base a voltage equal to $2V_{be}$.

In operation, when terminal 31 is at $V^+ - V_{be}$, current feeding back through R4 keeps Q4 on and Q2 and Q3 off. Transistor Q1, its base pulled up through R5 when Q2 and Q3 are off, keeps terminal 31 at $V^+ - V_{be}$. When terminal 31 is at $V_{be}$, due to the conduction of Q2, no current flows through R4 so that Q4 remains off and Q2 and Q3, of course, are on. Transistor Q2 cannot saturate, but instead is clamped at a collector voltage of $V_{be}$ by the emitter of Q9 whose base is held to $2V_{be}$. The total voltage swing at terminal 31 is thus $V^+ - 2V_{be}$ as illustrated by waveform W1 of FIG. 3.

Figure 4:
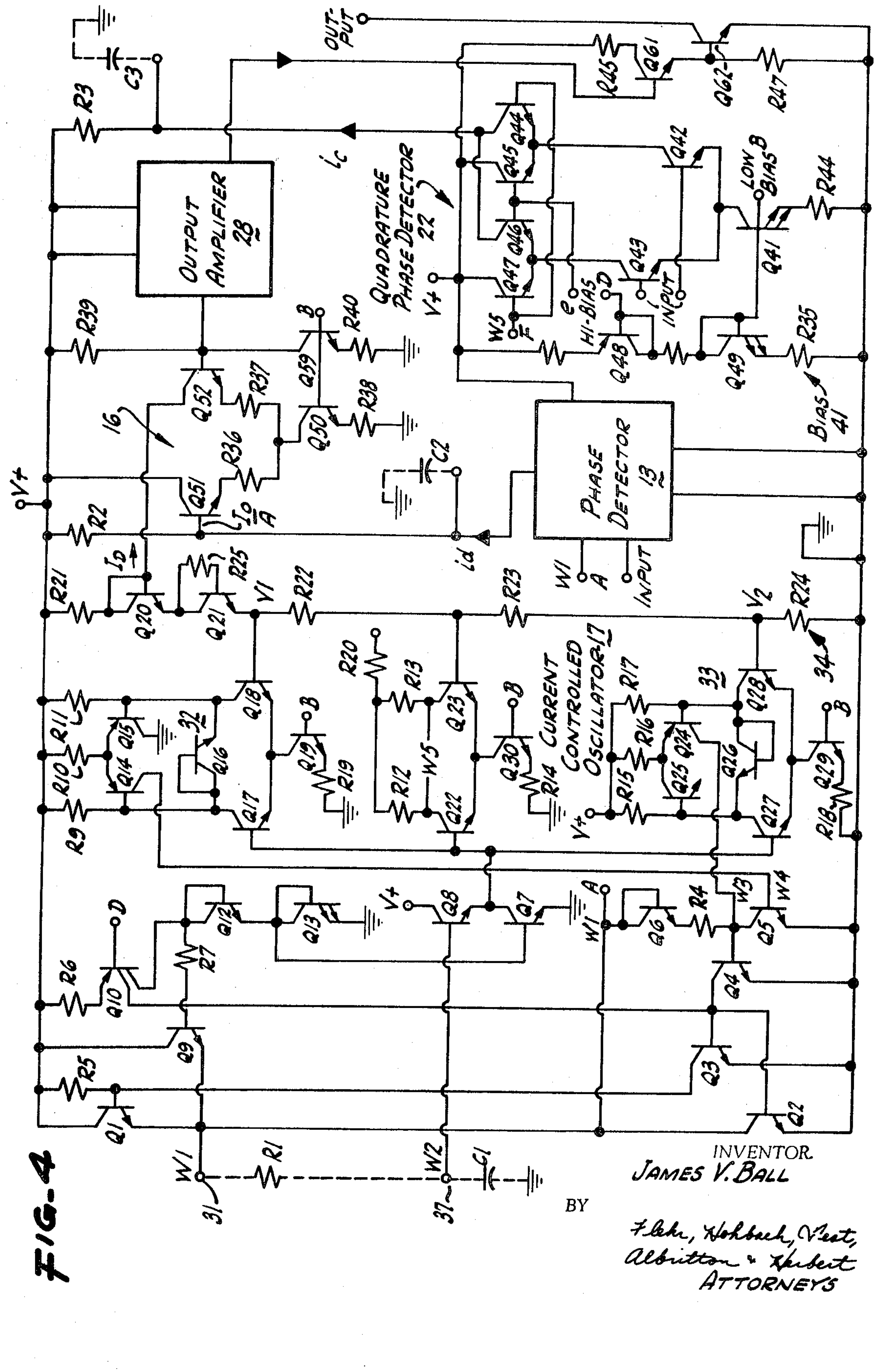
FIG. 4 is a detailed circuit schematic of FIG. 1.

The flip-flop Q1 – A4 is set and reset by comparators 32 and 33 which are shown in greater detail in FIG. 4. These comparators operate at voltages $V_1$ and $V_2$ respectively which are provided by resistor-transistor string 34 between $V^+$ and ground. The string includes diode coupled transistors Q20 and Q21 and series coupled resistors R21 through R24. The input terminals of comparators 32 and 33 are tied together on a line 36 and coupled to a terminal 37 between R1 and C1. The charge and discharge waveform which appears on this line is indicated by waveform W2 in FIG. 3. The output terminals of comparators 32 and 33 respectively provide a rest pulse W4 (FIG. 3) to the base of Q5 and a set pulse W3 to the base of Q4.

In operation when terminal 31 is high, that is Q1 is conducting, timing capacitor C1 is charged through timing resistor R1 until terminal 37 reaches $V_1$. Comparator 32 produces a rest pulse (waveform W4) which resets the flip-flop output on terminal 31 to $V_{be}$. Capacitor C1, as illustrated by waveform W2, discharges until the voltage drops at $V_2$, at which time comparator 33 produces a set pulse (waveform W3) which sets the flip-flop to its initial condition causing C1 to again charge. Waveform W2 at terminal 37 is thus an exponential pseudo-triangle waveform with a peak to peak amplitude $V_1 - V_2$.

When the sum of $V_1$ and $V_2$ is made equal to $V^+$, then the duty cycle of the square wave (waveform W1) is 50 percent. This is the situation when R21 is equal to R24 and the control current $I_0$ at the emitter of Q21 is 0. Such a duty cycle is, of course, preferred since this eliminates generation of a second harmonic signal which impairs the operation of the circuit. However, since the oscillator of FIG. 2 is a portion of a phase locked loop, it must track the input signal within its capture range. This is provided by variation of the current $I_0$. In order to allow $I_0$ to change the frequency in both directions, R21 is reduced in value and the voltage restored to its previous equality by means of a quiescent value of $I_0$. When $I_0$ is changed above and below this quiescent value, $V_1 - V_2$ decreases or increases to raise or lower the oscillator frequency. Moreover, as will be discussed below, for stability $I_0$ is made a function of $V^+ - 2V_{be}$ also.

A quadrature output of the oscillator frequency is derived by a differential amplifier which includes transistors Q22 and Q23. The base of transistor Q22 is coupled between resistors R22 and R23 in the resistor string 34 and the base input of Q23 is coupled to line 36 and terminal 37 upon which waveform W2 appears. Thus, whenever the capacitor voltage at terminal 37 crosses $(V_1 + V_2)/2$ switching occurs since the base input to transistor Q2 is at the middle point of the resistor string 34. The resultant waveform W5 thus appears at the collector output of transistors Q22 and Q23. Because of the slight exponential curve of W2, the quadrature output is not quite at 90° but is instead approximately 80°. This minor displacement does not seriously degrade performance in most applications since the sine function changes very slowly near 90°.

In accordance with the invention by making the amplitude $V_1 - V_2$ a function of $V^+ - 2V_{be}$ and by making the flip-flop voltage output W1 also proportional to the same function, the free running frequency $f_0$ of the oscillator is dependent upon only resistor R1 and capacitor C1 and resistor ratios which are constant with temperature in an integrated circuit.

The following derivation proves the foregoing. It is based on the assumption that switching voltages and delays in the comparators are negligible and that all base-emitter voltages track exactly. The total period of oscillation as illustrated by waveform W1 of FIG. 3 is $t_1 + t_2$. The relationship between these times and the charging voltages are $$V_1 - V_2 = (V_3 - V_2)(1 - e^{-t_1/R1C1}) \quad (1)$$

$$V_2 - V_1 = (V_4 - V_1)(1 - e^{-t_2/R1C1}) \quad (2)$$

where R1C1 is a product of R1 and C1. By appropriate manipulation $$t_1 + t_2 = R1C1\ 1n \frac{V_3 - V_2}{V_3 - V_1} \cdot \frac{V_4 - V_1}{V_4 - V_2} \quad (3)$$

incorporating the following substitutions, $$R_T = R21 + R22 + R23 + R24 \quad (4)$$

$$V_1 = \frac{R_T - R21}{R_T}(V^+ - 2V_{be}) + V_{be} \quad (5)$$

$$V_2 = \frac{R24}{R_T}(V^+ - 2V_{be}) + V_{be} \quad (6)$$

$$V_3 = V^+ - V_{be} \quad (7)$$

$$V_4 = V_{be} \quad (8)$$

yields the final equation $$t_1 + t_2 = R1C1\ 1n \frac{(R_T - R24)(R_T - R21)}{R21\ R24} \quad (9)$$

Thus, the period is shown to be solely a function of the external time constant as determined by R1 and C1 and the ratio of resistors in the resistor string or dividing network R21 – R24.

As discussed above, one application of the present invention is touch-tone decoding. Here a combination of two frequencies must be determined. In actually using the phase locked loop circuit as discussed above for tone decoding the detection band center frequency is set with the RC network R1C1, the detection bandwidth is set by adjusting the filter capacitor C2 and the output capacitor C3 smooths the output. With the present circuit a 100 milliampere load can be directly driven when the preselected frequency is present. By reason of the temperature stability discussed above, the stability of a tuning fork has been approached. In actual circuit tests, the relative drift per degree centigrade change of ambient temperature has been reduced to less than ±0.01 percent.

FIG. 4 illustrates the detailed circuit of the entire phase locked loop and lock detector as shown in FIG. 1. In addition, the topology of FIG. 4 is suitable for integration and all components shown in FIG. 4 are integrated except those coupled by dashed lines such as R1C1 and C2 and C3. The major purpose of providing these components external to the integrated circuit is to allow for adjustability as discussed above.

Figure 5:
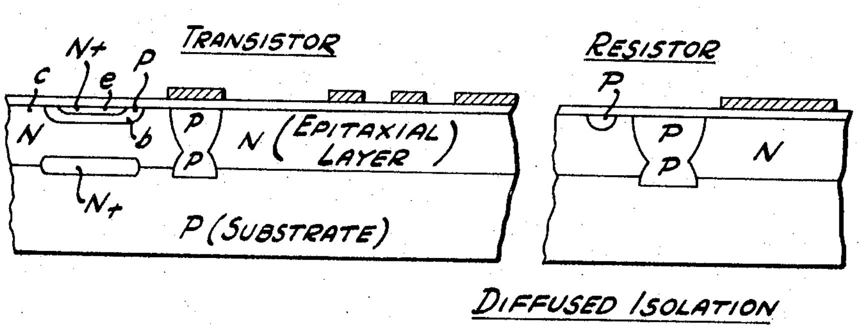
FIG. 5 is a typical cross-sectional view of the circuit of FIG. 4 in integrated form.

FIG. 5 shows a typical cross section of the circuit of FIG. 4 as it would be integrated showing a transistor with the base emitter and collectors so labeled with the polarity type material and with diffusion isolation. Also a resistor consisting of a P type layer is illustrated again with diffusion type isolation.

Referring specifically to the circuit of FIG. 4 a biasing network 41 coupled between $V^+$ and common and which includes transistors Q48 and Q49 provides a high bias level designated D at transistor Q48 and a low bias level at transistor Q49 designated B. The $V^+$ power supply is external. Transistor Q9 of the flip-flop circuit is supplied its $2V_{be}$ base input through a resistor R7 by means of diode connected transistors Q12 and Q13. Current source $I_2$ (FIG. 2) coupled to the collector of Q4 is actually provided by transistor Q10 coupled to $V^+$ through R6 which has high bias supply D coupled to its base input.

For improved temperature stability, emitter follower circuit Q7, Q8 is added between terminal 37 and the quadrature amplifier Q22, Q23, and in addition the comparators 32 and 33. This reduces current drain on capacitor C1. To compensate for the added $V_{be}$ drop at the comparators 32 and 33 diode connected transistor Q20 is moved to the top of the string 34 next to Q21. Furthermore, the resistor R25 is coupled between the base and collector of Q21 to compensate for the slight base current of Q1. Both resistor R25 and the base current of Q1 track in the same manner with temperature to thus maintain temperature stability. With the addition of resistor R25 the series resistance of R21, the diode resistance of Q20, and the parallel combination of R25 and the diode resistance of Q21 must be made equal to R24 in order to provide the 50 percent duty cycle which is desired.

As was discussed previously, for improved temperature stability, it is desirable that $I_0$ be made a function of $V^+ - 2V_{be}$ also. This is achieved in the $I_0$ amplifier 16 which includes transistors Q51 and Q52. Both of these transistors, of course, track temperature. Moreover, they are biased through transistor Q50 whose base input is coupled to the low bias input B. A bias string 41 provided tracking in accordance with the $V^+ - 2V_{be}$ requirement. The threshold voltage $V_t$ to output amplifier 28 is provided by transistor Q39 collector current flowing through R39.

Quadrature phase detector 22 includes transistors Q41 through Q47 and has its input on the terminals E and F designated W5 from the oscillator 17. The input from the signal terminal 10 is a complementary type of input which has previously been converted from a single ended input by phase detector 13.

The output from output amplifier 28 is coupled through transistor 61 and output transistor Q62.

In integrating the device of the present invention, for enhanced temperature stability it is preferred that the sensitive active components be located on substantially the same radius from the main heat source of the integrated circuit substrate. In the present invention this would be output transistor Q62. Thus, the comparator transistors Q14 through Q19 should be located on substantially the same radius and the other comparator transistors Q24 through Q28 should be similarly located. Finally, the amplifier transistors of amplifier 16, Q51 and Q52 should also be located on the same radius.

Thus, the present invention has provided a temperature stable integrated oscillator where the free running frequency is stable with temperature and is dependent only on values of the external components R1 and C1. Moreover, the free running frequency is also independent of supply voltages shown by the foregoing derivation. High speed operation of from 1 to 2 megahertz is possible and the entire device operates from a low voltage.

I claim:

1. An oscillator comprising: a semiconductive substrate; means for supplying a d.c. voltage, V; a flip-flop circuit integrated into said substrate having an output terminal and set and reset input terminals and including means for providing an output signal on said output terminal with a voltage swing proportional to $V - 2V_{be}$ where $V_{be}$ is the base to emitter voltage drop of each of two integrated transistors included in said circuit; a series resistor-capacitor timing circuit coupled to said output terminal of said flip-flop circuit; reference voltage means integrated into said substrate for providing first and second reference voltages having a difference which is a function of $V - 2V_{be}$ where $V_{be}$ is the base to emitter voltage drop of each of two integrated transistors included in said reference voltage means; and comparator means coupled to said flip-flop circuit and said resistor-capacitor circuit for respectively actuating said set and reset terminals in response to the voltage swing across said capacitor equalling said first and second reference voltages respectively.

2. An oscillator as in claim 1 where the sum of said first and second reference voltages is equal to V whereby the duty cycle of said output signal is 50 percent.

3. An oscillator as in claim 1 together with means for changing the difference between said first and second reference voltages to thereby change the frequency of oscillation of said output signal.

4. An oscillator as in claim 3 where said means for changing the difference is integrated into said substrate and is a function of $V - 2V_{be}$ where $V_{be}$ is the base to emitter voltage drop of integrated transistors included in such means.

5. An oscillator as in claim 1 where said means included in said flip-flop circuit for providing an output signal on said output terminal with a voltage swing proportional to $V - 2V_{be}$ includes a first integrated transistor coupling said output terminal to said voltage supply means, a second integrated transistor coupling said output terminal to common, and means responsive to activation of said set and reset terminals for toggling said first and second transistors to alternatively couple said output terminal to said voltage supply means and common through said respective transistors.

6. An oscillator as in claim 1 where said reference voltage means includes an integrated series resistor string including said two integrated transistors series-coupled, said first and second reference voltages being tapped off of said string.

7. An oscillator as in claim 6 where the two end resistors of said string are of equal value such resistors being respectively coupled between said voltage supply and common.

8. An oscillator as in claim 6 together with means for changing the difference between said first and second reference voltages including means for injecting an additional current in said string.

* * * * *